United States Patent
Hsieh

(10) Patent No.: US 6,766,208 B2
(45) Date of Patent: Jul. 20, 2004

(54) AUTOMATIC PRODUCTION QUALITY CONTROL METHOD AND SYSTEM

(75) Inventor: Pei-Chen Hsieh, Hsinchu (TW)

(73) Assignee: Powerchip Semiconductor Corp., Hsin-chu (TW)

( * ) Notice: Subject to any disclaimer, the term of this patent is extended or adjusted under 35 U.S.C. 154(b) by 83 days.

(21) Appl. No.: 10/211,452

(22) Filed: Aug. 2, 2002

(65) Prior Publication Data

US 2003/0060916 A1 Mar. 27, 2003

(30) Foreign Application Priority Data

Sep. 24, 2001 (TW) ........................................ 90123436 A

(51) Int. Cl.⁷ ............................................. G06F 19/00
(52) U.S. Cl. ....................... 700/109; 700/108; 700/117; 700/121
(58) Field of Search ........................... 700/90, 95, 108, 700/109–111, 117, 121; 438/5

(56) References Cited

U.S. PATENT DOCUMENTS 6,477,432 B1 * 11/2002 Chen et al. ................... 700/51
6,560,503 B1 * 5/2003 Toprac et al. ................ 700/108
6,604,012 B1 * 8/2003 Cho et al. .................... 700/121
6,629,009 B1 * 9/2003 Tamaki ........................ 700/108

* cited by examiner

Primary Examiner—Jayprakash N. Gandhi
(74) Attorney, Agent, or Firm—Ladas & Parry

(57) ABSTRACT

A method of controlling production quality of a wafer production line. The wafer production line includes a server having a database device, a plurality of manufacturing machines processing corresponding unit processes and a manufacturing executive system coupled to the server controlling the manufacturing machines. When the server determines that the wafers of the current lot do not comply with a predetermined specification, the manufacturing machines handling the wafers can be identified and the manufacturing executive system shuts down the identified manufacturing machines to calibrate parameters thereof. In addition, the wafers of the next lot are directly inspected to verify whether the identified manufacturing machines work well.

5 Claims, 3 Drawing Sheets

AUTOMATIC PRODUCTION QUALITY CONTROL METHOD AND SYSTEM

BACKGROUND OF THE INVENTION

1. Field of the Invention

The present invention relates in general to an automatic production quality control method and system in the semiconductor manufacturing industry. In particular, the present invention relates to a method and system for overcoming the drawbacks of conventional micro-analytical detection and defect inspection performed by hand, improving the efficiency of quality control in a semiconductor production line.

2. Description of the Related Art

In modern semiconductor manufacturing, various types of defects or failures may occur on the wafers due to unpredictable human factors, mechanical factors, and environmental factors. These defects may cause damage to the integrated circuits formed on the wafers, affecting function and production yield is reduced. As the complexity of the modern semiconductor wafer process grows and the scale of the integrated circuits increases, tiny particles, for example, with a diameter of 0.3 μm, may reduce production yield. In this situation, it is difficult for analysis personnel to analyze various wafer defects, such as identifying which unit processes are responsible for the wafer defects in question, analyzing the defect characteristics of manufacturing stations or machines in the production line, and analyzing the locations of defects or failure on the wafer or dies. In addition, the outcome of these defect analyses heavily depends on the completeness, accessibility, and timeliness of various production data.

FIG. 1 is a flowchart illustrating defect analyses in the conventional semiconductor manufacturing process. The conventional defect analyses of a processed wafer can be divided into two sections, online and offline monitoring, illustrated in the left portion and the right portion of FIG. 1, respectively.

The online monitoring section performs non-destructive and automatic detection in the production line. Generally speaking, diffusion/thin-film unit processes 11, photolithographic unit processes 12 and etching unit processes 13 are necessary in a standard semiconductor process. During these processes, localized defects or failure may occur on the surface and within the wafers due to uncontrollable operational factors. Thus, the inspector in the production line should regularly perform various inspections after developer/etching/thin-film processes 20 using various inline test instruments to examine the failure types of the wafers induced by these unit processes. Next, defect imaging detection 30 is performed on the wafers, for example, by scanning electron microscopes (SEMs), to obtain the defect distribution, defect locations, and the defect images on the wafers.

In the offline monitoring section, the finished wafer is first given a wafer acceptance test (WAT) 40, an electrical test, by appropriate equipment. Next, the wafers are tested by a surface inspection 50 for quality control to test whether the degree of particle-induced defect is within the requirement of the product client. The wafers are sliced into bare dies, each of which is tested by a chip probing (C/P) 60 or wafer probing test to identify good dies on the wafer or obtain production yield. In addition, a reliability analysis 70 is also required to evaluate the reliability characteristics.

Conventionally, various wafer defect data, yield data and inline inspection data in the inline and offline monitoring are collected as production data and stored in a database of a server for further analysis by other personnel.

When wafers in a given lot are prone to defects, thus reducing the total production yield, engineers search the database storing the production data to identify all of the manufacturing machines that have processed the wafers in the same lot. According to the findings of the search, the online engineers first halt the identified manufacturing machines to examine and calibrate the related parameters thereof to lower the possibility of reoccurrence of defect. However, since these calibration steps are manually performed in the conventional semiconductor industry, executive efficiency is quite low and online engineers must repeat the above steps to achieve calibration.

SUMMARY OF THE INVENTION

An object of the present invention is to provide a method of automatically controlling production quality of a wafer production line, which can integrate various defect, yield, and online inspection data with a manufacturing executive system (hereafter called MES) to upgrade the efficiency of the operation.

According to the above objective, the present invention provides a method of controlling production quality of a wafer production line. The wafer production line includes a server having a database device, a plurality of manufacturing machines processing corresponding unit processes and a MES coupled to the server controlling the manufacturing machines. This method comprises the steps of:

(a) inspecting wafers of a first lot to generate production data and storing the production data to the database device;

(b) judging whether the wafers of the first lot comply with a predetermined specification by the server according to the stored production data;

(c) identifying the manufacturing machines that have handled non-compliant wafers of the first lot;

(d) notifying the manufacturing executive system of the information of the identified manufacturing machines by the server;

(e) halting the identified manufacturing machines and calibrating parameters thereof by the manufacturing executive system;

(f) processing wafers of a second lot by the identified manufacturing machines;

(g) inspecting the wafers of the second lot;

(h) returning back to step (e) when the wafers of the second lot do not comply with the predetermined specification; and (i) printing a statistic form when the wafers of the second lot comply with the predetermined specification.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The present invention utilizes the automatic concept to simplify the quality control workload conventionally performed by manpower. More specifically, the present invention discloses a method of automatically calibrating the manufacturing machines when the wafers in a given lot are prone to defect and production yield is reduced. The embodiment of the present invention is discussed as follows.

Figure 1:
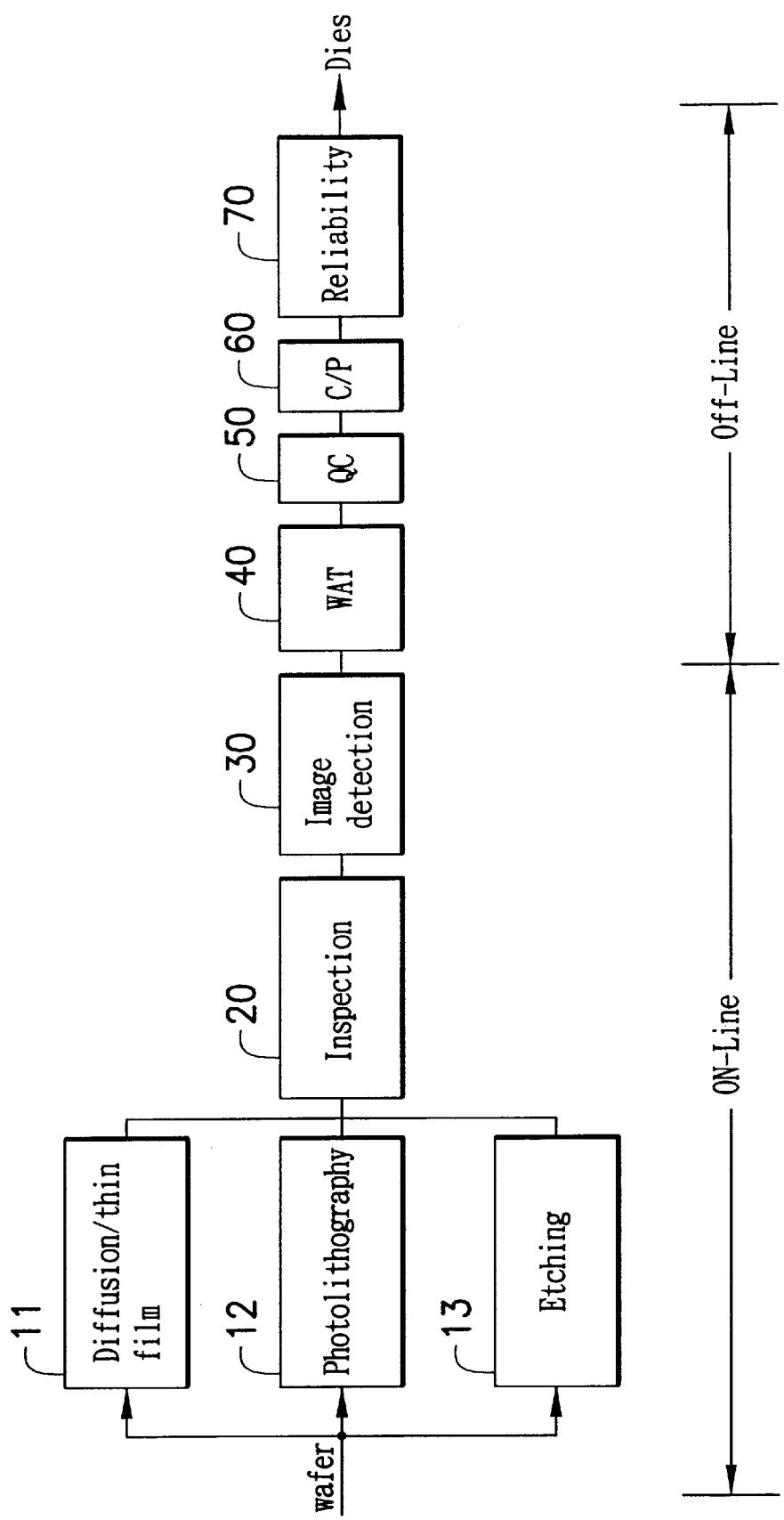
FIG. 1 (Prior Art) is a flowchart illustrating the defect analyses in the conventional semiconductor manufacturing process.
Figure 2:
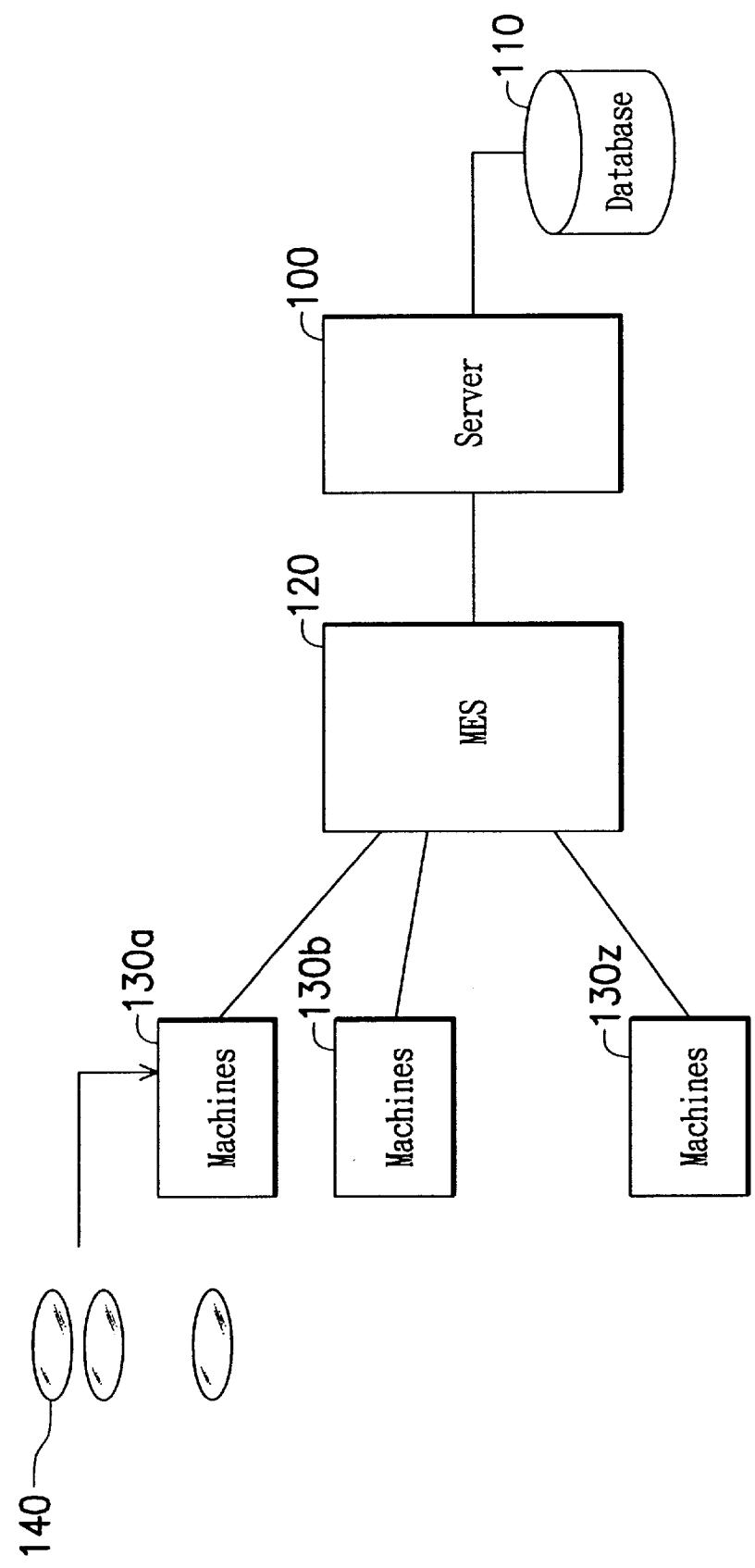
FIG. 2 is a block diagram of the production line utilizing the method of automatically controlling production quality of a wafer production line in accordance with the embodiment of the present invention.

FIG. 2 is a block diagram of the production line utilizing the method of automatically controlling production quality of a wafer production line in accordance with the embodiment of the present invention. As shown in FIG. 2, the production line includes a server 100, a database device 110 that can be accessed by the server 100, a plurality of manufacturing machines 130$a$–130$z$ performing corresponding unit processes (such as etching, photolithographic and thin-film processes) on wafers 140, and a manufacturing executive system (MES) 120 driving the manufacturing machines 130$a$–130$z$ to perform the unit processes. It is noted that the wafers 140 may have distinctive lot numbers. Database 110 stores various defect data, yield data, online inspected data and works-in-process (WIP) data acquired by various online or offline test instruments (not shown). When the wafers of the same lot are inspected by these test instruments, the inspected outcomes are collected as production data and stored in the database 110. The stored production data of database 110 and the MES 120 can be integrated using the server to automatically control production quality of the wafer production line.

When the manufacturing machines 130$a$–130$z$ perform the unit processes on the wafers 140 under the control of the manufacturing executive system 120, the relationship of the wafers and the manufacturing machines handling the wafers is recorded as the WIP database. Thus, when the wafers 140 of a lot are prone to defect, the manufacturing machines that have processed the wafers can be identified using the WIP database.

Figure 3:
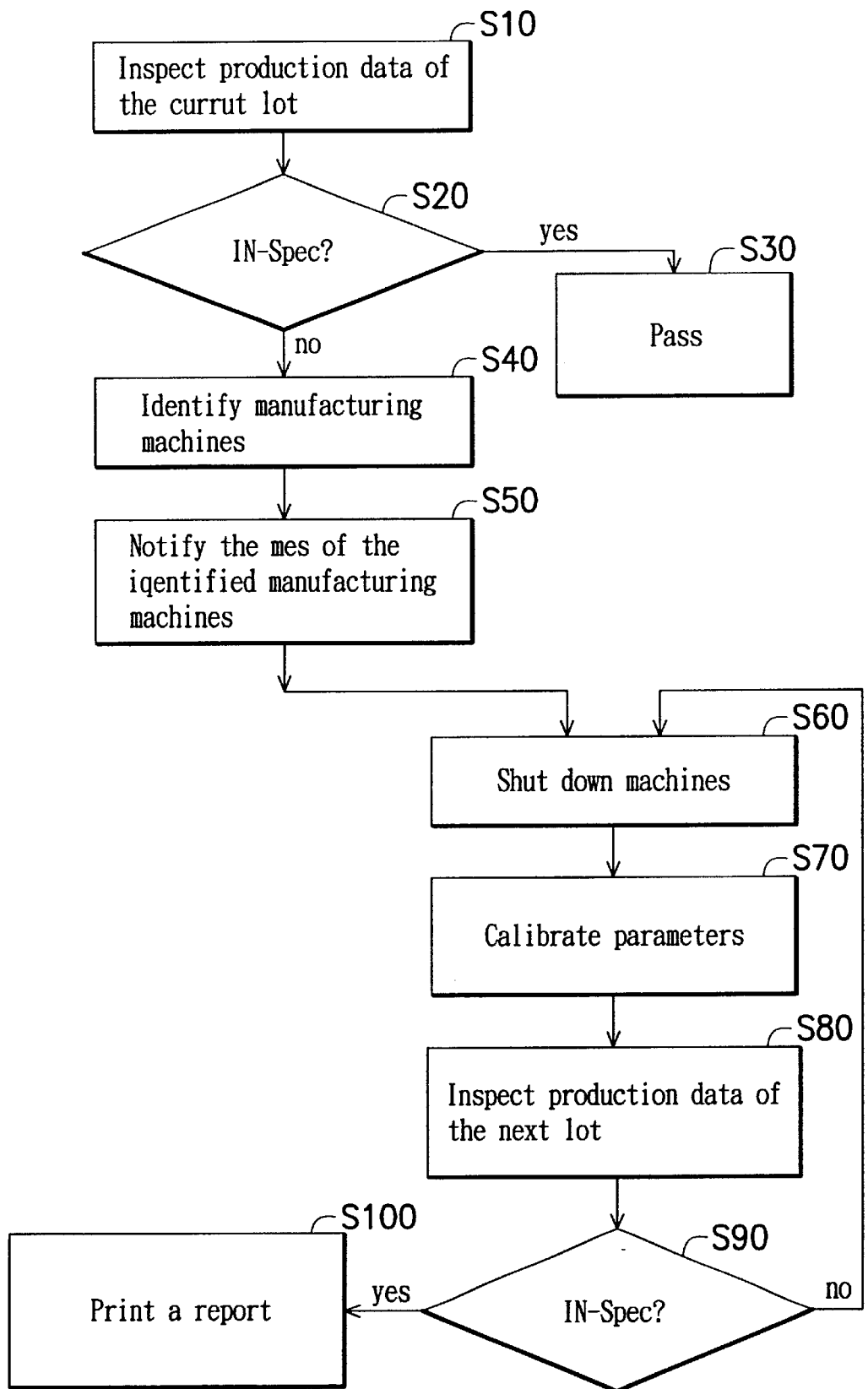
FIG. 3 is a flowchart illustrating the method of automatically controlling production quality of a wafer production line in accordance with the embodiment of the present invention.

FIG. 3 is a flowchart illustrating the method of automatically controlling production quality of a wafer production line in accordance with the embodiment of the present invention. The wafers of a current lot are processed by the manufacturing machines 130$a$–130$z$ under the control of the manufacturing executive system 120 and simultaneously tested by various online and offline test instruments. First, the server inspects the production data stored in the database device 110 and determines whether the wafers of the current lot comply with a predetermined specification (step S10). The predetermined specification varies with products and the applied process technology. If the inspection reveals that the wafers of the current lot comply with the predetermined specification (or so-called in-spec) (Step S20), the wafers are good and allowed to pass the examination (Step S30). On the other hand, if the inspection reveals that the wafers of the current lot do not comply with the predetermined specification (or called out-of-spec) (Step S20), the manufacturing machines that have processed the wafers should be calibrated to lower the possibility of the defect occurrences.

At this time, the server 100 can identify the manufacturing machines that have processed the wafers of the current lot by means of the WIP database (Step S40). Subsequently, the server 100 notifies the manufacturing executive system 120 of the information regarding the identified manufacturing machines and the manufacturing executive system 120 directly inspects the wafers of subsequent lots handled by the identified manufacturing machines (Step S50).

The manufacturing executive system 120 receives the information of the identified manufacturing machines and shuts them down (Step S60). After calibrating the operational parameters thereof, they are restarted (Step S70). Subsequently, the identified manufacturing machines continue to process the wafers of the next lot. In addition, the online and offline monitoring operations are directly performed on the wafers of the next lot to determine whether they comply with the predetermined specification or not (Step S80). If the inspection reveals that the wafers of the next lot do not comply with the predetermined specification either (Step S90), the identified manufacturing machines are calibrated again (back to Step S60). If the inspection reveals that the wafers of the next lot comply with the predetermined specification, the wafers are good and allowed to pass the examination and a statistic report can be printed (Step S100). Therefore, the quality control of the wafer production line can be achieved by an automatic scheme.

According to the above description, the method of automatically controlling production quality of a wafer production line in accordance with the present invention can integrate the manufacturing executive system with various online and inline production data to improve the efficiency of the quality control of the semiconductor industry.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of automatically controlling production quality of a wafer production line that includes a server having a database device, a plurality of manufacturing machines processing corresponding unit processes and a manufacturing executive system coupled to the server, controlling the manufacturing machines, comprising:

(a) inspecting wafers of a first lot to generate production data and storing the production data in the database device;

(b) judging whether the wafers of the first lot comply with a predetermined specification by the server according to the stored production data;

(c) identifying the manufacturing machines that handled the wafers of the first lot when the wafers of the first lot do not comply with the predetermined specification;

(d) notifying the manufacturing executive system of the information about the identified manufacturing machines identified by the server;

(e) halting the identified manufacturing machines and calibrating parameters thereof by the manufacturing executive system;

(f) processing wafers of a second lot by the identified manufacturing machines;

(g) inspecting the wafers of the second lot; and (h) returning back to step (e) when the wafers of the second lot do not comply with the predetermined specification.

2. The method of claim 1, further comprising:
(i) printing a statistic form when the wafers of the second lot comply with the predetermined specification.

3. A system of automatically controlling production quality of a wafer production line, comprising:
- a server having a database device;
- a plurality of test instruments for inspecting wafers, generating production data pertaining to the wafers and storing the production data to the database device;
- a plurality of manufacturing machines performing corresponding unit processes on the wafers; and
- a manufacturing executive system, coupled to the server and the manufacturing machines, driving the manufacturing machines to perform the corresponding unit processes;
- wherein the server judges whether the wafers of a first lot comply with a predetermined specification according to the production data pertaining to the wafers of the first lot, and identifies the manufacturing machines that handled the wafers of the first lot when the wafers of the first do not comply with the predetermined specification;
- wherein the server notifies the manufacturing executive system of the information about the manufacturing machines identified by the server;
- wherein the manufacturing executive system halts the identified manufacturing machines to calibrate parameters thereof; and
- wherein wafers of a second lot are directly handled by the identified manufacturing machines and inspected by the test instruments.

4. The system of claim 3, wherein the manufacturing executive system halts the identified manufacturing machines to calibrate the parameters thereof when the wafers of the second lot do not comply with the predetermined specification, and then forces wafers of a third lot are directly handled by the identified manufacturing machines and inspected by the test instruments.

5. The system of claim 3, wherein the server prints a statistic form when the wafers of the second lot comply with the predetermined specification.

* * * * *